United States Patent
Zheng et al.

(10) Patent No.: US 10,861,728 B2
(45) Date of Patent: Dec. 8, 2020

(54) VACUUM ADSORPTION UNIT AND VACUUM ADSORPTION CARRIER

(71) Applicant: BOE TECHNOLOGY GROUP CO., LTD., Beijing (CN)

(72) Inventors: Hanbo Zheng, Beijing (CN); Li Li, Beijing (CN); Junwei Yan, Beijing (CN); Changhai Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 395 days.

(21) Appl. No.: 15/730,756

(22) Filed: Oct. 12, 2017

(65) Prior Publication Data
US 2018/0247848 A1 Aug. 30, 2018

(30) Foreign Application Priority Data
Feb. 28, 2017 (CN) .......................... 2017 1 0113401

(51) Int. Cl.
*B25B 11/00* (2006.01)
*H01L 21/673* (2006.01)

(52) U.S. Cl.
CPC ...... *H01L 21/67393* (2013.01); *B25B 11/005* (2013.01); *H01L 21/67383* (2013.01); *H05K 2203/0195* (2013.01)

(58) Field of Classification Search
CPC .... B25B 11/005; B65G 47/91; B25J 15/0625; B25J 15/0616; B25J 15/0633; B25J 15/0666
(Continued)

(56) References Cited

U.S. PATENT DOCUMENTS 4,640,503 A * 2/1987 Naumann ............ B65H 3/0883
271/103
5,692,357 A 12/1997 McCain
(Continued)

FOREIGN PATENT DOCUMENTS

CN 1274657 A 11/2000
CN 2409190 Y 12/2000
(Continued)

OTHER PUBLICATIONS

First Office Action for Chinese Patent Application No. 201710113401.1 dated Mar. 28, 2018.

*Primary Examiner* — Lee D Wilson
*Assistant Examiner* — Mahdi H Nejad
(74) *Attorney, Agent, or Firm* — Calfee, Halter & Griswold LLP

(57) ABSTRACT

The present disclosure discloses a vacuum adsorption unit and a vacuum adsorption carrier, wherein the vacuum adsorption unit comprises: a housing defining an air path through-hole therein, the air path through-hole provided with an upper abutting surface and a lower abutting surface; a piston movable provided in the air path through-hole and is located between the upper abutting surface and the lower abutting surface; an outer peripheral wall of the piston is slidably matched with an inner peripheral wall of the air path through-hole; an elastic member having both ends that respectively abut against the housing and the piston, to constantly drive the piston to abut on the upper abutting surface; and a pressure relief passage communicated with the air path through-hole, and is configured to be closed only when the piston moves to abut against the lower abutting surface.

16 Claims, 7 Drawing Sheets

(58) Field of Classification Search
USPC .......................................................... 294/183
See application file for complete search history.

(56) References Cited

U.S. PATENT DOCUMENTS

| | | | |
|---|---|---|---|
| 5,695,600 A | | 12/1997 | Goin |
| 6,065,789 A | * | 5/2000 | Nagai ..................... B41F 21/06 |
| | | | 294/185 |
| 10,040,205 B2 | * | 8/2018 | Yamamuro ............... B25J 15/06 |
| 2005/0205744 A1 | * | 9/2005 | Singh ....................... F16B 47/00 |
| | | | 248/351 |
| 2016/0176056 A1 | * | 6/2016 | Bentrim ............... B25J 15/0625 |
| | | | 294/183 |

FOREIGN PATENT DOCUMENTS

| | | | |
|---|---|---|---|
| CN | 2554138 Y | | 6/2003 |
| CN | 102518815 A | | 6/2012 |
| CN | 203156623 U | | 8/2013 |
| CN | 205057607 U | | 3/2016 |
| DE | 102016203171 | * | 2/2016 |

\* cited by examiner

VACUUM ADSORPTION UNIT AND VACUUM ADSORPTION CARRIER

CROSS REFERENCE TO RELATED APPLICATIONS

This application claims the priority to and the benefit of Chinese Patent Application No. 201710113401.1, filed on Feb. 28, 2017, which is incorporated herein by reference in its entirety.

TECHNICAL FIELD

The present disclosure relates to a vacuum adsorption field, and particularly to a vacuum green unit and a vacuum adsorption carrier.

BACKGROUND

In recent years, sizes of the substrate adsorbed by a vacuum adsorption carrier of the related art intend to be diversified. It is general to close the vacuum suction tank temporarily unused on the substrate carrier by sticking an adhesive tape in order to meet requirements of different sizes of substrate, in this case, the operation of closing the vacuum suction tank is inconvenient and wastes manpower.

SUMMARY

The present disclosure is intended to at least solve one of the technical problems existed in the prior art. To this end, the present disclosure provides a vacuum adsorption unit, which can control adsorption state of the vacuum adsorption unit on the basis of different air pressure difference generated on the upper and lower sides of a piston according to whether one end for adsorption of an air path through-hole is covered or not, to achieve work automation of the vacuum adsorption unit and automatically close the uncovered one end for adsorption of the air path through-hole.

The present disclosure further provides a vacuum adsorption carrier, comprising a vacuum adsorption unit as above described.

According to one aspect of an embodiment of the present disclosure, it is provided with a vacuum adsorption unit, which comprises:

a housing defining an air path through-hole therein, the air path through-hole is provided with an upper abutting surface and a lower abutting surface;

a piston movable provided in the air path through-hole and located between the upper abutting surface and the lower abutting surface, an outer peripheral wall of the piston is slidably matched with an inner peripheral wall of the air path through-hole;

an elastic member having both ends that respectively abut against the housing and the piston, to constantly drive the piston to abut against the upper abutting surface; and a pressure relief passage communicated with the air path through-hole, and configured to be closed only when the piston moves to abut against the lower abutting surface.

According to another aspect of the embodiment of the present disclosure, it is provided with a vacuum adsorption carrier, which comprises:

a substrate carrier provided with a vacuum suction tank;
a vacuum adsorption unit connected with the vacuum suction tank in fit manner;
wherein, the vacuum adsorption unit comprises:

a housing defining an air path through-hole therein, the air path through-hole is provided with an upper abutting surface and a lower abutting surface;

a piston movably provided in the air path through-hole and located between the upper abutting surface and the lower abutting surface, an outer peripheral wall of the piston slidably matches with an inner peripheral wall of the air path through-hole;

an elastic member having both ends that respectively abut against the housing and the piston, to constantly drive the piston to abut against the upper abutting surface; and a pressure relief passage communicated with the air path through-hole, and is configured to be closed only when the piston moves to abut against the lower abutting surface.

Additional aspects and advantages of the disclosure will be set forth in part in the description which follows and in part will become apparent to those having ordinary skill in the art upon examination of the following or may be learned from practice of the disclosure.

BRIEF DESCRIPTION OF THE DRAWINGS

The foregoing and/or additional aspects and advantages of the present disclosure are apparent and easily understood from the following detailed description taken in conjunction with the accompanying drawings, in which.

Figure 1:
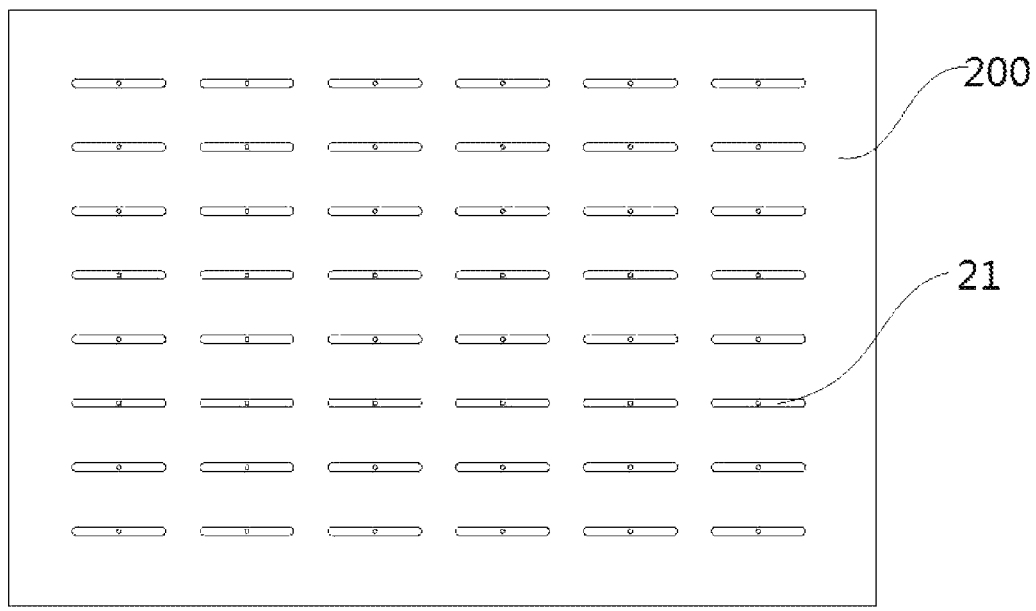
FIG. 1 is a top view of a substrate carrier according to the embodiment of the present disclosure.
Figure 2:
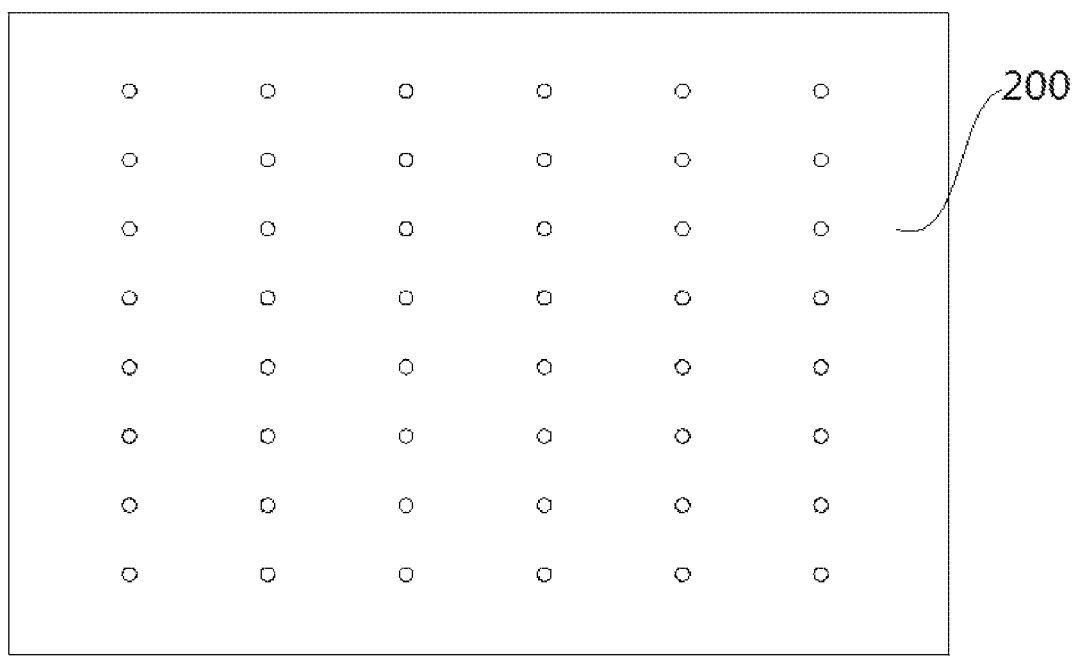
FIG. 2 is a bottom view of a substrate carrier according to the embodiment of the present disclosure.

REFERENCE SIGNS vacuum adsorption unit 100; substrate carrier 200; housing 1; cylinder 11; outer sleeve 110; inner sleeve 111; stopper 12; gasket 13; upper abutting surface 14; lower abutting surface 15; piston 2; elastic member 3; pressure relief passage 4; vacuum suction tank 21; air path through-hole 300; through hole 400.

DETAILED DESCRIPTION

Embodiments of the present disclosure will be described in details and are illustratively shown in the accompanying drawings, wherein the same or similar reference signs refer to the same or similar elements or elements having the same or similar function throughout the document. The embodiments described below with reference to the accompanying drawings are exemplary, only for explaining the present disclosure but cannot be construed as limiting the present disclosure.

In the description of the present disclosure, it is should be understood that directional or positional relationship as indicated by the terms "up", "down", "vertical", "horizontal", "top", "inner" and "outer" is the directional or positional relationship as shown in the drawings, only in order to facilitate for description of the present disclosure and simplify the description, but not to intend or imply that the means or elements as indicated must have a specific orientation and be constructed and operated in a particular orientation, thereby it cannot be construed as limiting the present disclosure. In the description of the present disclosure, the meaning of "plural" is two or more, unless specified otherwise.

In the description of the present disclosure, it is should be noted that unless otherwise expressly regulated and defined, the terms "connect" should be broadly understood, for example, a fixed connection, a detachable connection, or integral connection; a mechanical connection, an electrical connection; a direct connection, indirect connection via an intermediate medium, or communication between the two elements. For the normal person skilled in the art, the specific meanings of the above terms can be understood according to the actual situations.

Hereinafter, FIGS. 1-7 illustrate a vacuum adsorption unit 100 according to an embodiment of the present disclosure. The vacuum adsorption unit 100 may be applied to a vacuum adsorption carrier. The vacuum adsorption carrier as known includes a substrate carrier 200 on which a vacuum suction tank 21 is provided.

As shown in FIGS. 1-7, the vacuum adsorption unit 100 according to the embodiment of the present disclosure includes a housing 1, a piston 2, an elastic member 3 and a pressure relief passage 4.

Specifically, housing 1 defines an air path through-hole 300 therein, and the pressure relief passage 4 is communicated with the air path through-hole 300. An upper abutting surface 14 and a lower abutting surface 15 are provided within the air path through-hole 300. It may be thus understood that both ends of the air path through-hole 300 are respectively communicated with the vacuum suction tank 21 and a vacuum pipeline (not shown) to implement adsorption work of the vacuum adsorption unit. Each vacuum suction tank 21 may be connected to the air path through-hole 300 of the vacuum adsorption unit 100, when a plurality of vacuum suction tanks 21 are provided on the substrate carrier 200.

The piston 2 is movably disposed within the air path through-hole 300 and is located between the upper abutting surface 14 and the lower abutting surface 15, and the outer peripheral wall of the piston 2 and the inner peripheral wall of the air path through-hole 300 are in sliding connection. It can be seen that in the air path through-hole 300, the upper and lower sides of the piston 2 are completely separated from each other, that is, the upper and lower sides of the piston 2 are located in two portions respectively. Thus, the air path through-hole 300 is divided into two portions by the piston 2.

Figure 5:
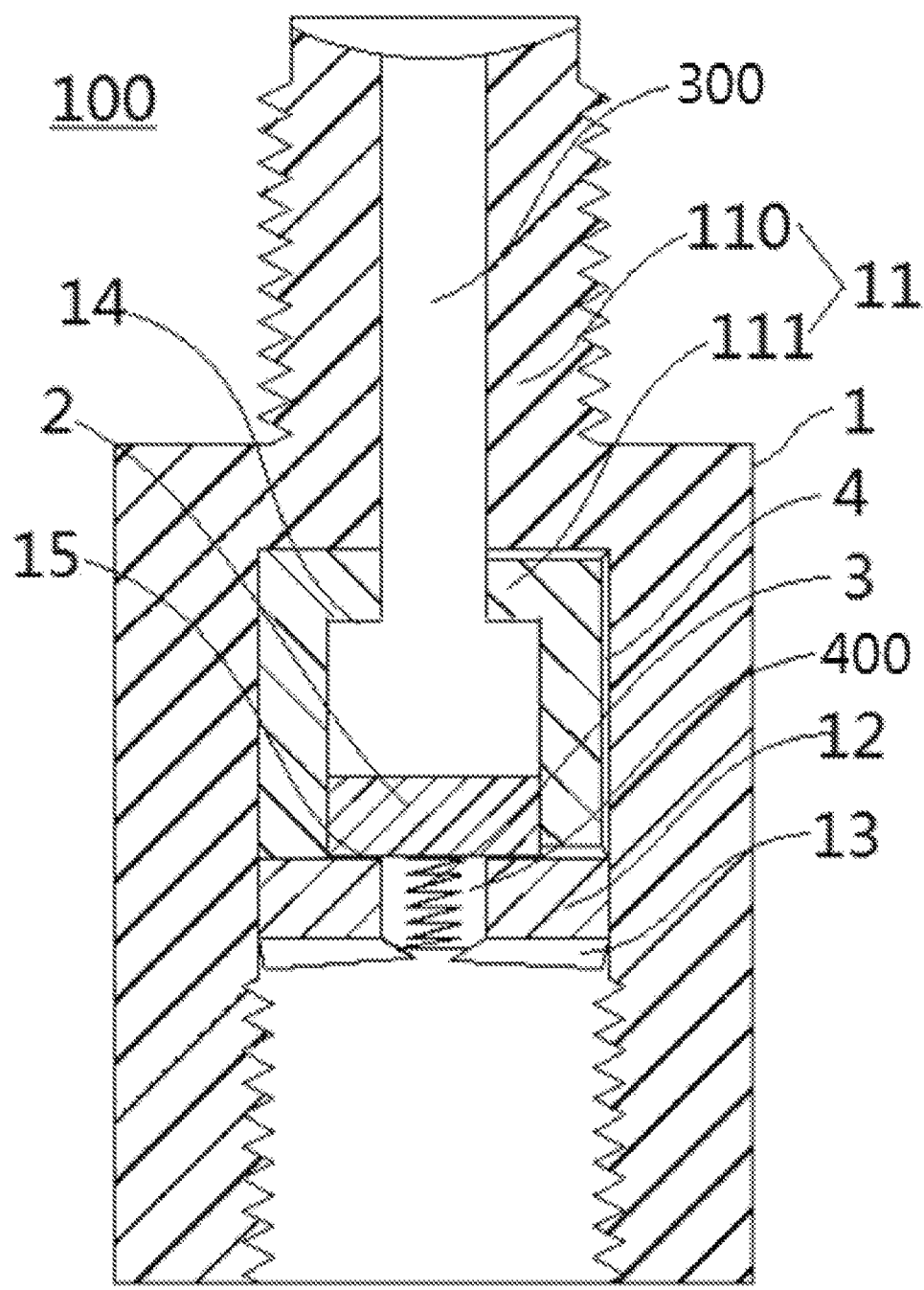
FIG. 5 is a schematic view of a piston abuts against the lower abutting surface when the vacuum adsorption unit is operated according to the embodiment of the present disclosure.

Both ends of the elastic member 3 respectively abut against the housing 1 and piston 2 to constantly drive the piston 2 to be abutted against the upper abutting surface 14. The pressure depression passage 4 is configured such that the pressure depression passage 4 is closed when the piston 2 moves and abuts against the lower abutting surface 15, as shown in FIG. 5. As can be seen, when the substrate carrier 200 is in a non-operating state, the vacuum adsorption unit 100 does not adsorb vacuum, and the piston 2 is abutted at the upper abutting surface 14 under the action of pushing of the elastic member 3. It can be understood that the two ends of the elastic member 3 can abut against the housing 1 and the upper end surfaces of the piston 2 respectively, or abut against the housing 1 and the lower end surfaces of the piston 2 respectively, as long as the elastic member 3 can constantly drive the piston 2 to be abutted against the upper abutting surface 14. If both ends of the elastic member 3 abut against the housing 1 and the upper end surfaces of the piston 2 respectively, when pressure on the upper side of the piston 2 is greater than pressure on the lower side of the piston 2, the piston 2 will overcome the elastic force of the elastic member under the action of air pressure difference to gradually move downwardly, at this time, the elastic member 3 is stretched and generates upward pulling force; when the air pressure difference of the upper and lower sides of the piston 2 are equal to each other, the piston 2 will move upwardly under the action of the pulling force of the elastic member 3 to abut against the upper abutting surface 14 to be stabilized. If the both ends of the elastic member 3 respectively abut against the housing 1 and the lower end surfaces of the piston 2, when the pressure on the upper side of the piston 2 is greater than the pressure on the lower side of the piston 2, the piston 2 will overcome elastic force of the elastic member under action of the air pressure difference to gradually move downwardly, at this time, the elastic member 3 is compressed and generates upward pushing force; when the air pressure difference of the upper and lower sides of the piston 2 are equal to each other, the piston 2 will move upwardly under the action of the pushing force of the elastic member 3 to abut against the upper abutting surface 14 to be stabilized.

When the substrate carrier 200 is in working condition and the vacuum suction tank 21 is not covered, the vacuum adsorption unit 100 adsorbs the vacuum, the air path through-hole 300 on the upper side of the piston 2 is communicated with the outdoor air through the vacuum suction tank 21, such that a standard atmospheric pressure is formed on the upper side of the piston 2, the lower side of the piston 2 is communicated with the vacuum pipeline, such that an air pressure difference is formed on the upper and lower sides of the piston 2. The piston 2 can overcome the elastic force of the elastic member 3 under the action of the air pressure difference to gradually move downwardly. The pressure relief passage 4 continuously releases pressure to the upper side of the piston 2 during the piston 2 is moving downwardly. When the piston 2 moves downwardly to abut against the lower abutting surface 15, the pressure relief passage 4 is closed, and the air pressure difference on the upper and lower sides of the piston 2 is greater than the air pressure difference when being communicated in the pressure relief passage 4, such that the piston 2 is stably abutted against the lower abutting surface 15, furthermore, the vacuum adsorption unit 100 stops the adsorption work, and the vacuum suction tank 21 is closed so as to cut off air circulation between the vacuum suction tank 21 and the vacuum pipeline.

When the substrate carrier 200 is in the work operation and the vacuum suction tank 21 is covered, the vacuum adsorption unit 100 adsorbs the vacuum, and the lower side of the piston 2 is connected to the vacuum pipeline. At the beginning, the air pressure in the air path through-hole 300 on the upper side of the piston 2 is greater than the air pressure on the lower side of the piston 2, such that the piston 2 moves downwardly. The pressure relief passage 4 continuously releases pressure to the upper side of the piston 2 during the piston 2 moves downwardly. If the pressure relief passage 4 has a weaker pressure relief effect, the air pressure on the upper side of the piston 2 is always greater than the air pressure on the lower side of the piston 2, such that the piston 2 can overcome elastic force of the elastic member 3 to move downwardly to abut against the lower abutting surface 15, and furthermore, the piston 2 closes the pressure relief passage 4 to stop pressure relief of the pressure relief passage 4. Herein, due to the pressure relief function of the pressure relief passage 4, the air pressure on the upper side of the piston 2 is less than the outdoor standard atmospheric pressure, such that the vacuum adsorption unit 100 can absorb the substrate. If pressure relief passage 4 has a sufficient pressure relief effect, the air pressure on the upper and lower sides of the piston 2 can be equal to each other, such that the piston 2 moves under the elastic force of the elastic member 3 to abut against the upper abutting surface 14 to be stabilized, and the vacuum adsorption unit 100 continuously adsorbs the substrate. As can be seen, the vacuum adsorption unit 100 can control adsorption state thereof on the basis of the different air pressure differences generated on the upper and lower sides of the piston 2 according to whether the vacuum suction tank 21 is covered or not, which could achieve work automation for the vacuum adsorption unit 100, The vacuum adsorption unit 100 according to the embodiment of the present disclosure includes a movable piston 2 provided in the air path through-hole 300, and a pressure relief passage 4 in communication with the air path through-hole 300. The pressure relief passage 4 is configured to be closed when the piston 2 moves and abuts against the lower abutting surface 15, such that the adsorption state of the vacuum adsorption unit 100 can be controlled on the basis of different air pressure difference generated on the upper and lower sides of the piston 2 according to whether the vacuum suction tank 21 is covered or not, automation of the vacuum adsorption unit 100 can be achieved, and the vacuum suction tank 21 that is not covered on the substrate carrier 200 can be automatically closed.

Figure 7:
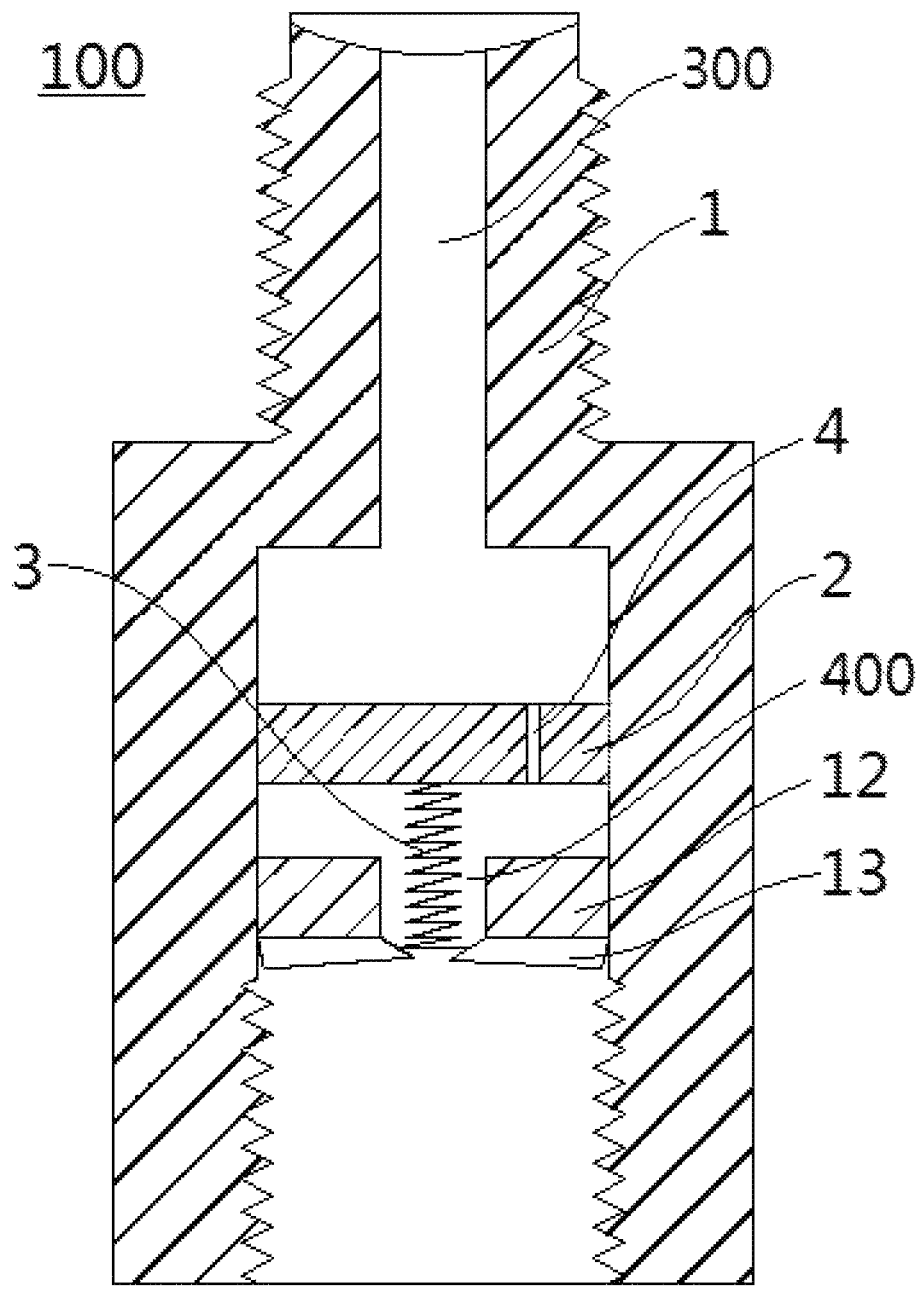
FIG. 7 is a schematic view of a vacuum adsorption unit according to a further embodiment of the present disclosure.

Optionally, as shown in FIG. 7, the pressure depression passage 4 is provided on the piston 2, and the lower abutting surface 15 plugs the pressure relief passage 4, when the piston 2 moves to abut against the lower abutting surface 15. As a result, the structure of the pressure relief passage 4 is simple, and the manufacturing cost of the vacuum adsorption unit 100 can be reduced.

Optionally, as shown in FIG. 3 to FIG. 6, the pressure depression passage 4 is provided in the housing 1, the upper end of the pressure relief passage 4 is located above the upper abutting surface 14, and the lower end of the pressure relief passage 4 is located above the lower abutting surface 15. The side wall of the piston 2 plugs the lower end of the pressure relief passage 4 to close the pressure relief passage 4, when piston 2 moves to abut against the lower abutting surface 15. As a result, the structure of the pressure relief passage 4 is more stable, and the pressure relief effect can be more reliable.

Figure 3:
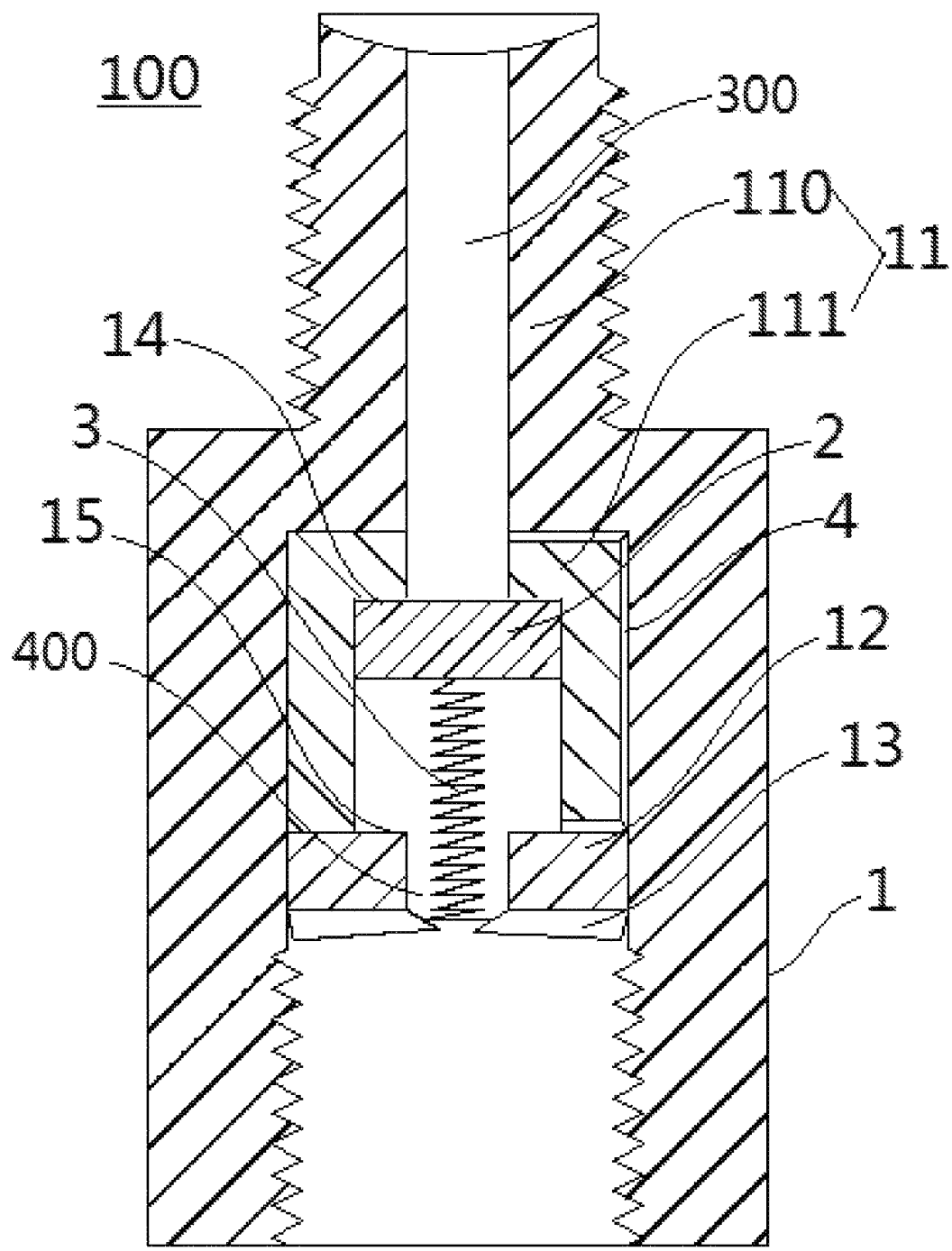
FIG. 3 is a schematic view of a vacuum adsorption unit according to the embodiment of the present disclosure.
Figure 4:
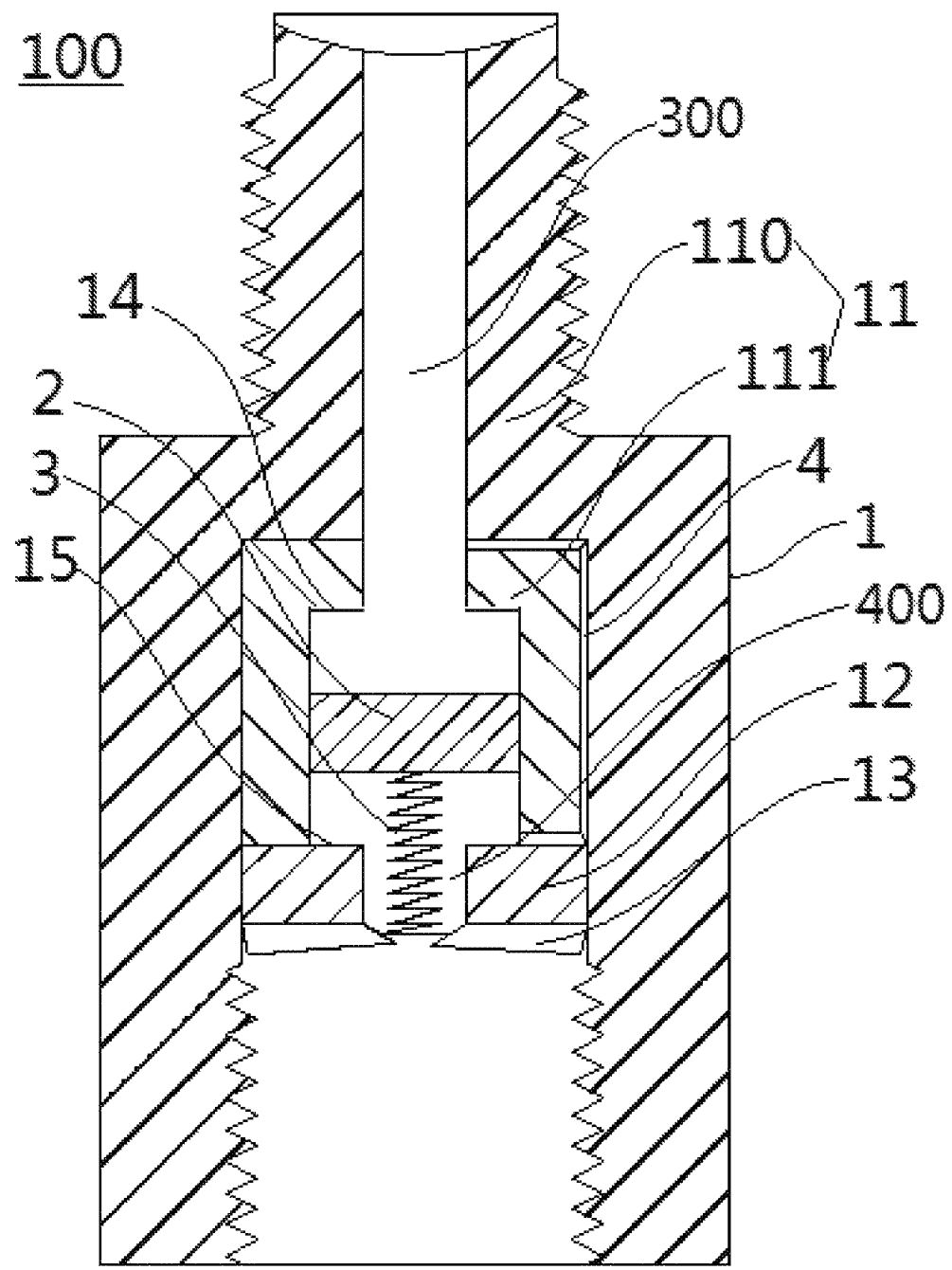
FIG. 4 is a schematic view of a piston movement when the vacuum adsorption unit is operated according to the embodiment of the present disclosure.

As shown in FIG. 3 to FIG. 5, according to some embodiments of the present disclosure, the housing 1 includes a cylinder 11, a stopper 12 and a gasket 13. The cylinder body 11 defines an air passage through-hole a therein. The stopper 12 is provided on the inner wall of the air path through-hole 300, and is provided with a through hole 400 communicated with the air path through-hole 300. The upper surface of the stopper 12 defines a lower abutting surface 15. The gasket 13 is provided on the lower surface of the stopper 12. The lower end of the elastic member 3 passes through the through hole 400 to abut against the gasket 13. As a result, the structure of the vacuum green unit 100 is simple and reliable.

Figure 6:
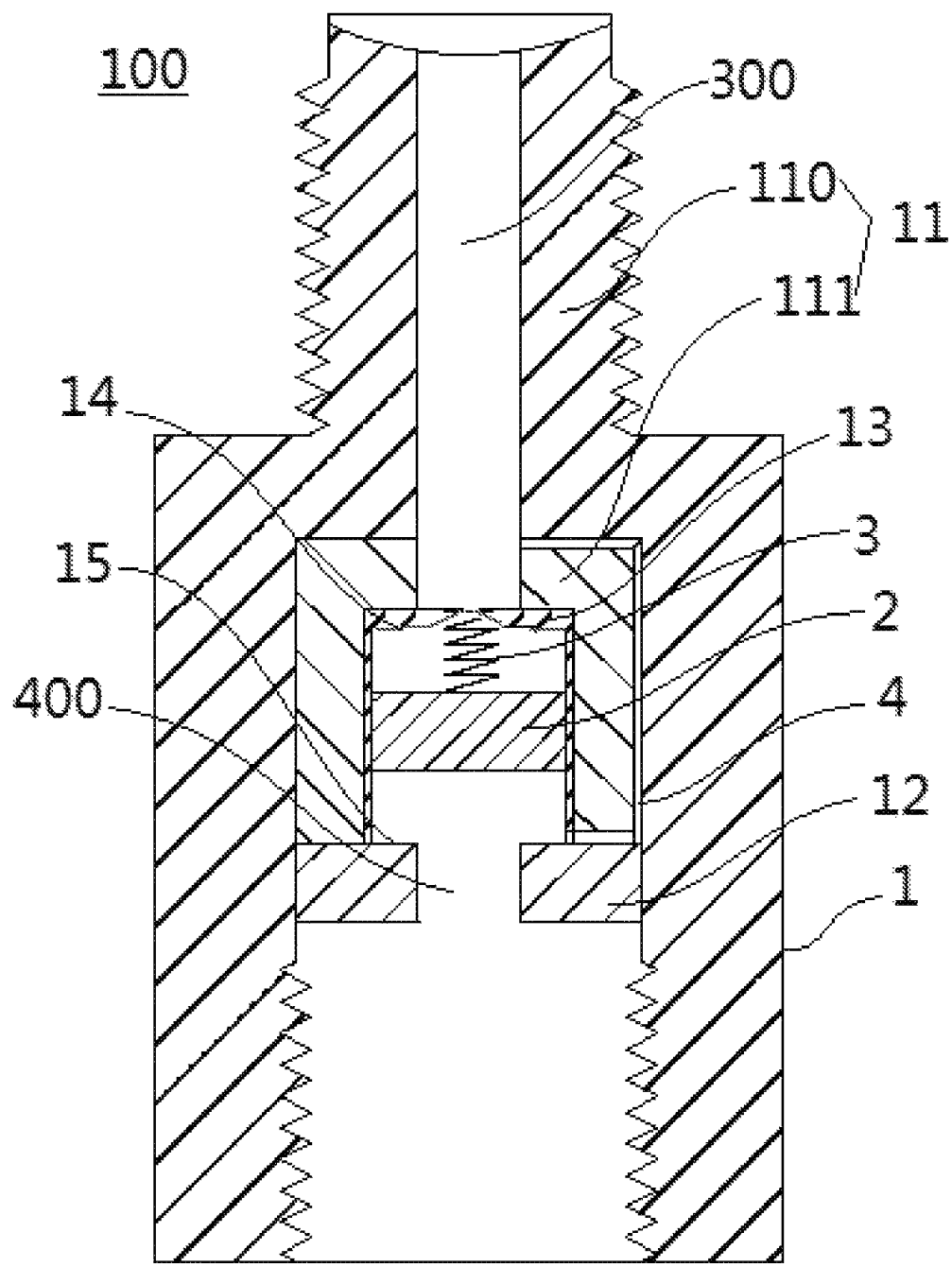
FIG. 6 is a schematic view of a vacuum adsorption unit according to another embodiment of the present disclosure.

As shown in FIG. 6, according to further embodiments of the present disclosure, the housing 1 includes a cylinder 11, a stopper 12 and a gasket 13. The stopper 12 is provided on the inner wall of the air path through-hole 300, and is provided with a through hole 400 communicated with the air path through-hole 300. The upper surface of the stopper 12 defines a lower abutting surface 15. The gasket 13 is provided on the inner wall of the cylinder 11 and is located above the stopper 12. The elastic member 3 is located above the piston 2 and has upper and lower ends connected to the gasket 13 and the piston 2, respectively. As can be seen, when pressure on the upper side of the piston 2 is greater than pressure on the lower side of the piston 2, the piston 2 will overcome the elastic force of the elastic member under the action of air pressure difference to gradually move downwardly, at this time, the elastic member 3 is stretched and generates upward pulling force; when the air pressure difference of the upper and lower sides of the piston 2 are equal to each other, the piston 2 will move upwardly under the action of the pulling force of the elastic member 3 to abut against the upper abutting surface 14 to be stabilized.

Particularly, the cylinder 11 includes a hollow outer sleeve 110 and a hollow inner sleeve 111. The inner sleeve 111 is provided in the outer sleeve 110 and is located above the stopper 12. The pressure relief passage 4 is defined between the outer peripheral wall of the inner sleeve 111 and the inner peripheral wall of the outer sleeve 110. The piston 2 is movably provided in the inner sleeve 111. The lower surface of the top end of the inner sleeve 111 defines the upper abutting surface 14. As can be seen, arrangement of the pressure relief passage 4 is simple.

Particularly, the inner top wall of the inner sleeve 111 defines the upper abutting surface 14.

Furthermore, the upper end of the housing 1 is provided with an external thread, correspondingly, the vacuum suction tank 21 is provided with an internal thread that matches with the external thread on the housing 1. Thusly, it is helpful to install the vacuum adsorption unit 100 onto the substrate carrier 200, so that the vacuum adsorption unit 100 and the substrate carrier 200 could be connected simply, thusly being disassembled and replaced easily.

Furthermore, the inner peripheral wall of the lower end of the air path through-hole 300 is provided with an internal thread, correspondingly, the vacuum pipeline is provided with an external thread that matches with the internal thread on the air path through-hole 300. Thusly, it is helpful to connect the vacuum adsorption unit 100 with the vacuum pipeline, so that the vacuum adsorption unit 100 and the vacuum pipeline could be connected simply, thusly being disassembled and replaced easily.

Optionally, the elastic member 3 is a spring, such that the cost of the vacuum adsorption unit 100 is reduced while ensuring the function that the elastic member 3 pushes the piston 2.

Particularly, the cross-sectional area of the pressure depression passage 4 remains constant, so that the gas flow rates in every position of the pressure relief passage 4 are the same, which could ensure the pressure relief function of the pressure relief passage 4 and also make the structure of the pressure relief passage 4 simple and manufacture convenient.

Optionally, the piston 2 is a PTFE material, so that the piston 2 has good quality, good sealing and light weight.

The vacuum adsorption carrier according to the embodiment of the present disclosure includes a substrate carrier 200 and a vacuum adsorption unit 100 according to the embodiment of the present disclosure.

The substrate carrier 200 is provided with a vacuum suction tank 21 which is matched with and connected to the vacuum adsorption unit 100.

In the vacuum adsorbent according to the embodiment of the present disclosure, the vacuum adsorption unit 100 according to the above embodiment of the present disclosure is provided such that the absorption state of the vacuum adsorption unit 100 can be controlled on the basis of different air pressure difference generated on the upper and lower sides of the piston 2 according to whether the vacuum suction tank 21 is covered or not, thus, the work automation of the vacuum adsorption carrier can be achieved.

Furthermore, the vacuum suction tank 21 is in plural, and the vacuum adsorption unit 100 is in plural and matches with a plurality of vacuum suction tanks 21, respectively, to avoid the adsorption work of the plurality of vacuum suction tanks 21 from interfering with each other, thusly making the work of the vacuum adsorption carrier work more stable and reliable.

Other configuration and operation of the vacuum adsorption carrier according to embodiment of the present disclosure are known to the person skilled in the art, herein, the detailed description will be omitted.

The vacuum adsorption carrier according to one specific embodiment of the present disclosure will now be described in detail with reference to FIGS. 1-5. However, it should be noted that the following description is exemplary only, and that, after reading the following technical solutions of the present disclosure, it will be apparent to those skilled in the art that a technical solution or a portion of the technical features may be combined or replaced, Falls within the scope of protection required by the present disclosure.

As shown in FIG. 1 to FIG. 5, the vacuum adsorption carrier according to the embodiment of the present disclosure includes a substrate carrier 200 and a plurality of vacuum adsorption units 100.

The substrate carrier 200 is provided with a plurality of vacuum suction tanks 21 which are correspondingly connected with the plurality of vacuum adsorption units 100, respectively.

The vacuum adsorption unit 100 comprises a housing 1, a piston 2, an elastic member 3 and a pressure relief passage 4. The housing 1 defines an air path through-hole 300. The air path through-hole 300 has one end that is adapted to communicate with the vacuum suction tank 21, and the other end that is adapted to connect with the vacuum pipeline. The air path through-hole 300 is provided with an upper abutting surface 14 and a lower abutting surface 15.

Particularly, the upper end of the housing 1 is provided with an external thread to be connected to the vacuum suction tank 21 on the substrate carrier 200. The inner peripheral wall of the lower end of the air path through-hole 300 is provided with an inner thread to connect with the vacuum pipeline. The housing 1 comprises a cylinder 11, a stopper 12 and a gasket 13. The cylinder 11 defines an air path through hole a therein. The cylinder 11 comprises a hollow outer sleeve 110 and a hollow inner sleeve 111. The inner sleeve 111 is provided in the outer sleeve 110 and is located above the stopper 12. The stopper 12 is provided with a through hole 400 in communication with the air path through-hole 300. The upper surface of the stopper 12 defines a lower abutting surface 15. The inner top wall of the inner sleeve 111 defines an upper abutting surface 14. The gasket 13 is provided on the lower surface of the stopper 12. The elastic member 3 is a spring and has both ends that respectively abut against the lower end surfaces of the gasket 13 and the piston 2 to constantly push the piston 2 to abut against the upper abutting surface 14.

The piston 2 is a PTFE material piece. The piston 2 is movably provided in the inner sleeve 111 and is located between the upper abutting surface 14 and the lower abutting surface 15. The outer peripheral wall of piston 2 slidably matches with the inner peripheral wall of air path through-hole 300. The pressure relief passage 4 is defined between the outer peripheral wall of the inner sleeve 111 and the inner peripheral wall of the outer sleeve 110. The upper end of the pressure relief passage 4 is located above the upper abutting surface 14, and the lower end of the pressure relief passage 4 is located above the lower abutting surface 15, at the same time, the cross-sectional area of the pressure relief passage 4 remains constant. The side wall of the piston 2 plugs the lower end of the pressure relief passage 4 to close the pressure relief passage 4, when the piston 2 moves to abut against the lower abutting surface 15.

Any reference in this specification to "one embodiment" "some embodiments" "illustrative embodiment", "example", "specific example" or "some examples" etc., means that a particular feature, structure, material or characteristic described in connection with the embodiment is included in at least one embodiment of the example. The appearances of such phrases in various places in the specification are not necessarily all referring to the same embodiment or example. Further, when a particular feature, structure, material or characteristic is described in connection with any one or more embodiments or examples.

Although the embodiments of this disclosure have been shown and described, it could be understood by those skilled in the art that various modifications and variations can be made in the present disclosure without departing from the spirit or scope of the disclosures. Thus, the scope of the present disclosure can be defined by the appended claims and their equivalents.

What is claimed is:

1. A vacuum adsorption unit comprising:
   a housing defining an air path through-hole therein, the air path through-hole is provided with an upper abutting surface and a lower abutting surface;
   a piston movably provided in the air path through-hole and located between the upper abutting surface and the lower abutting surface, an outer peripheral wall of the piston is slidably matched with an inner peripheral wall of the air path through-hole;
   an elastic member having an upper end and a lower end that respectively abut against an abutment piece of the housing and the piston, to constantly drive the piston to abut against the upper abutting surface; and
   a pressure relief passage communicated with the air path through-hole, and configured to be closed only when the piston moves to abut against the lower abutting surface;
   wherein, the pressure relief passage is provided in the housing, an upper end of the pressure relief passage is located above the upper abutting surface, a lower end of the pressure relief passage is located above the lower abutting surface, a side wall of the piston plugs the lower end of the pressure relief passage to close the pressure relief passage when the piston moves to abut against the lower abutting surface.

2. The vacuum adsorption unit according to claim 1, wherein, the housing comprises:
   a cylinder defining the air path through-hole therein;
   a stopper provided on an inner wall of the air path through-hole, the stopper is provided with a through hole in communication with the air path through-hole, an upper surface of the stopper defines the lower abutting surface; and the abutment piece provided on a lower surface of the stopper, the elastic member is provided under the piston, and the lower end of the elastic member passes through the through hole to abut against the abutment piece;

wherein the abutment piece is a gasket.

3. The vacuum adsorption unit according to claim 2, wherein, the cylinder comprises:

a hollow outer sleeve;

a hollow inner sleeve provided in the outer sleeve and located above the stopper, the pressure relief passage is defined between an outer peripheral wall of the inner sleeve and the inner peripheral wall of the outer sleeve, the piston is movably provided in the inner sleeve.

4. The vacuum adsorption unit according to claim 3, wherein, an inner top wall of the inner sleeve defines the upper abutting surface.

5. The vacuum adsorption unit according to claim 1, wherein, the housing comprises:

a cylinder defining the air path through-hole therein;

a stopper provided on an inner wall of the air path through-hole, the stopper is provided with a through hole in communication with the air path through-hole, an upper surface of the stopper defines the lower abutting surf ace; and the abutment piece provided on an inner wall of the cylinder and located above the stopper, the elastic member is located above the piston, the upper and lower ends of the elastic member are connected to the abutment piece and the piston, respectively wherein the abutment piece is a gasket.

6. The vacuum adsorption unit according to claim 5, wherein, the cylinder comprises:

a hollow outer sleeve; and a hollow inner sleeve provided in the outer sleeve and located above the stopper, the pressure relief passage is defined between the outer peripheral wall of the inner sleeve and the inner peripheral wall of the outer sleeve, the piston is movably provided in the inner sleeve.

7. The vacuum adsorption unit according to claim 6, wherein, an inner top wall of the inner sleeve defines the upper abutting surface.

8. The vacuum adsorption unit according to claim 1, wherein, an upper end of the housing is provided with external threads.

9. The vacuum adsorption unit according to claim 1, wherein, the inner peripheral wall of the lower end of the air path through-hole is provided with internal threads.

10. The vacuum adsorption unit according to claim 1, wherein, the elastic member is a spring.

11. The vacuum adsorption unit according to claim 1, wherein, a cross-sectional area of the pressure relief passage remains constant.

12. A vacuum adsorption carrier comprising:

a substrate carrier provided with a vacuum suction tank;

a vacuum adsorption unit connected with the vacuum suction tank in fit manner; wherein, the vacuum adsorption unit comprises:

a housing defining an air path through-hole therein, the air path through-hole is provided with an upper abutting surface and a lower abutting surface;

a piston movably provided in the air path through-hole and located between the upper abutting surface and the lower abutting surface, an outer peripheral wall of the piston slidably matches with an inner peripheral wall of the air path through-hole;

an elastic member having an upper end and a lower end that respectively abut against an abutment piece of the housing and the piston, to constantly drive the piston to abut against the upper abutting surface; and a pressure relief passage communicated with the air path through-hole, and is configured to be closed only when the piston moves to abut against the lower abutting surface;

wherein, the pressure relief passage is provided in the housing, an upper end of the pressure relief passage is located above the upper abutting surface, and a lower end of the pressure relief passage is located above the lower abutting surface, a side wall of the piston plugs the lower end of the pressure relief passage to close the pressure relief passage when the piston moves to abut against the lower abutting surface.

13. The vacuum adsorption carrier according to claim 12, wherein, the vacuum suction tank is in plural, the vacuum adsorption unit is in plural and is connected with a plurality of vacuum suction tank in a corresponding and fit manner.

14. The vacuum adsorption carrier according to claim 12, wherein, the housing comprises:

a cylinder defining the air path through-hole therein;

a stopper, which is provided on an inner wall of the air path through-hole, the stopper is provided with a through hole in communication with the air path through-hole, an upper surface of the stopper defines the lower abutting surface; and the abutment piece provided on a lower surface of the stopper, the elastic member is provided under the piston, and the lower end of the elastic member passes through the through hole to abut on the abutment piece;

wherein the abutment piece is a gasket.

15. The vacuum adsorption carrier according to claim 12, wherein, the housing comprises:

a cylinder defining the air path through-hole therein;

a stopper provided on an inner wall of the air path through-hole, the stopper is provided with a through hole in communication with the air path through-hole, an upper surface of the stopper defines the lower abutting surf ace; and the abutment piece provided on an inner wall of the cylinder and located above the stopper, the elastic member is located above the piston, the upper and lower ends of the elastic member are connected to the abutment piece and the piston, respectively;

wherein the abutment piece is a gasket.

16. The vacuum adsorption carrier according to claim 15, wherein, the cylinder comprises:

a hollow outer sleeve;

a hollow inner sleeve provided in the outer sleeve and located above the stopper, the pressure relief passage is defined between an outer peripheral wall of the inner sleeve and the inner peripheral wall of the outer sleeve, the piston is movably provided in the inner sleeve.

* * * * *